US006542395B2

(12) United States Patent
Chrysostomides et al.

(10) Patent No.: US 6,542,395 B2
(45) Date of Patent: Apr. 1, 2003

(54) INTEGRATED DRAM MEMORY MODULE

(75) Inventors: Athanasia Chrysostomides, München (DE); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/082,553

(22) Filed: Feb. 25, 2002

(65) Prior Publication Data
US 2002/0118564 A1 Aug. 29, 2002

(30) Foreign Application Priority Data
Feb. 23, 2001 (DE) .......................................... 101 08 744

(51) Int. Cl.[7] ................................................ G11C 5/06
(52) U.S. Cl. ............................ 365/63; 365/51; 365/205
(58) Field of Search ............................. 365/51, 63, 149, 365/205

(56) References Cited

U.S. PATENT DOCUMENTS 5,636,158 A    6/1997  Kato et al. ..................... 365/63
5,886,938 A *  3/1999  Haukness ..................... 365/205
6,288,927 B1 * 9/2001  Inaba et al. ..................... 365/63
6,384,445 B1 * 5/2002  Hidaka et al. .............. 257/306

* cited by examiner

Primary Examiner—Son Mai
(74) Attorney, Agent, or Firm—Laurence A. Greenberg; Werner H. Stemer; Ralph E. Locher

(57) ABSTRACT

The integrated DRAM memory module has sense amplifiers which are each formed, in the integrated module, from a multiplicity of transistor structures that are arranged regularly in cell arrays and include amplification transistors for bit line signal amplification. The amplification transistors lie opposite one another in pairs, are structurally identical, and are arranged equally spaced apart in rows. Voltage equalization transistors ensure voltage equalization between sense amplifier drive signals. The cell array order provides for each row with amplification transistors situated in a structurally identical transistor environment to be interrupted in a predetermined period by voltage equalization transistors. The structure of the voltage equalization transistors in a region of proximity to the adjoining amplification transistors is adapted to the structure thereof, and the voltage equalization transistors are at the same distance from the mutually adjoining amplification transistors as the amplification transistors of the same row are from one another.

3 Claims, 2 Drawing Sheets

INTEGRATED DRAM MEMORY MODULE

BACKGROUND OF THE INVENTION

Field of the Invention

The invention lies in the integrated technology field. More specifically, the invention relates to an integrated DRAM memory module, with sense amplifiers that are each formed in the integrated module from a multiplicity of transistor structures arranged regularly in cell arrays and comprise amplification transistors for bit line signal amplification, which lie opposite one another in pairs, are structurally identical and are arranged equally spaced apart in rows, and voltage equalization transistors for voltage equalization between sense amplifier drive signals. The cell array order or structure provides for each row comprising amplification transistors situated in a structurally identical transistor environment to be interrupted in a predetermined period by voltage equalization transistors.

In an integrated memory module of this type, the amplification of the bit line signal is typically performed by four amplification transistors. In each case four amplifier transistors of adjacent sense amplifiers are arranged in a row or in strip form next to one another in the layout and thus form a regular structure. In particular, these transistors are in each case arranged such that they lie opposite one another in pairs in the rows, are formed structurally identically and are arranged uniformly spaced apart from one another in the row or in the strip. On account of the very small dimensions of the respective sense amplifier, this regular structure is a necessary prerequisite for an exact imaging of a given design geometry onto a wafer.

This regular structure of amplification transistors is interrupted in predetermined periods by a structure comprising voltage equalization transistors, which typically cooperate with one another in pairs and provide a voltage equalization between sense amplifier drive signals. On account of the interposed voltage equalization transistors, in the region of these transistors, the extremely uniform geometry of the amplification transistors arranged in rows is interrupted. The consequence of this is that the amplification transistors adjoining the voltage equalization transistors find a different proximity in their position opposite the voltage equalization transistors than in their position opposite the adjoining amplification transistors of the respective row. Typically, the distance between the voltage equalization transistors and the amplification transistors in a row is also different from the distance between the amplification transistors where no voltage equalization transistors are present. In other words, in the repeated pattern of the amplification transistors arranged in rows, a gap arises where the voltage equalization transistors are located. For the exposure of the wafer, this means, as a result of the absent proximity, the structure changes with the aid of the corresponding mask, which can lead to undesired structural effects.

SUMMARY OF THE INVENTION

It is accordingly an object of the invention to provide an integrated DRAM memory component, which overcomes the above-mentioned disadvantages of the heretofore-known devices and methods of this general type and in which the proximity of the amplification transistors to every location of the transistor rows is identical.

With the foregoing and other objects in view there is provided, in accordance with the invention, an integrated DRAM memory module, comprising:

a plurality of sense amplifiers each formed from a multiplicity of transistor structures arranged in rows and comprising amplification transistors for bit line signal amplification, the amplification transistors lying opposite one another in pairs, being structurally identical, and arranged uniformly spaced apart in the row;

voltage equalization transistors for voltage equalization between sense amplifier drive signals disposed to interrupt a respective row formed with amplification transistors situated in a structurally identical transistor environment;

the voltage equalization transistors having a structure in a region of proximity to respectively adjoining the amplification transistors identical to a structure of the adjoining the amplification transistors; and the voltage equalization transistors being spaced from the adjoining amplification transistors at a spacing distance equal a spacing distance between the amplification transistors of the row.

In accordance with an added feature of the invention, facing edges of mutually adjacent amplification transistors and voltage equalization transistors are formed with an identical contour.

In accordance with a concomitant feature of the invention, there is provided a dummy structure interrupting the row formed of amplification transistors situated in a structurally identical transistor environment. The dummy structure in the region of proximity to the adjoining amplification transistors is adapted identically to a structure thereof, and the dummy structure is spaced a distance from the mutually adjoining amplification transistors that equals a spacing distance between the amplification transistors of the row.

In other words, the invention accordingly provides, for the integrated DRAM memory module under discussion, that in an integrated DRAM memory module, with sense amplifiers which are each formed, in the context of the integrated module, from a multiplicity of transistor structures arranged regularly in cell arrays and comprise amplification transistors for bit line signal amplification, which lie opposite one another in pairs, are structurally identical and are arranged equally spaced apart in rows, and voltage equalization transistors for voltage equalization between sense amplifier drive signals (NCS, PCS), the cell array ordering providing for each row comprising amplification transistors situated in a structurally identical transistor environment to be interrupted in a predetermined period by voltage equalization transistors, characterized in that the structure of the voltage equalization transistors in the region of proximity to the adjoining amplification transistors is adapted to the structure thereof, and in that the voltage equalization transistors to be at the same distance from the mutually adjoining amplification transistors as the amplification transistors of the same row are from one another.

Accordingly, the invention provides identical proximities for all of the amplification transistors by virtue of the fact that the same structure or the same layout is allocated to the voltage equalization transistors adjoining the adjacent amplification transistors, and also by virtue of the fact that the distance between voltage equalization transistors and adjoining amplification transistors is made the same, primarily identical to the distances between the amplification transistors within a row.

Merely by way of example this means that, when the edges of the adjoining amplification transistors facing the voltage equalization transistors have an L shape, the same L shape is mirrored at the edges of the voltage equalization transistors, and that these L-shaped proximity structures are at the same distance as in the proximity structures within the row of adjoining amplification transistors.

The expressions "identical layout" or "identical structure" or "identical structural edges" of the transistors, as used throughout this text, are to be understood as layout identities between the transistor constituents, for example the gates thereof.

In a generalized manner, the invention provides identical proximities for all of the amplification transistors in a row of amplification transistors of the sense amplifiers of the integrated DRAM memory module under discussion, to be precise including at the locations where this identical proximity is disturbed or interrupted in the DRAM memory modules according to the prior art, namely where there are regions of other proximity structures, in particular in the form of voltage equalization transistors.

However, this also applies to those structural disturbance regions which have another function, such as dummy structures for instance. In this case, too, the invention is employed and provides for identical amplification transistor environments by virtue of the fact that the respective dummy structure in the region of proximity to the adjoining amplification transistors is adapted to the structure thereof, and that the dummy structure is at the same distance from the mutually adjoining amplification transistors as the amplification transistors of the same row are from one another. In this case, the dummy structure in the region of proximity to the adjoining amplification transistors is preferably identical to the structure or edge contour thereof.

Other features which are considered as characteristic for the invention are set forth in the appended claims.

Although the invention is illustrated and described herein as embodied in an integrated DRAM memory module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
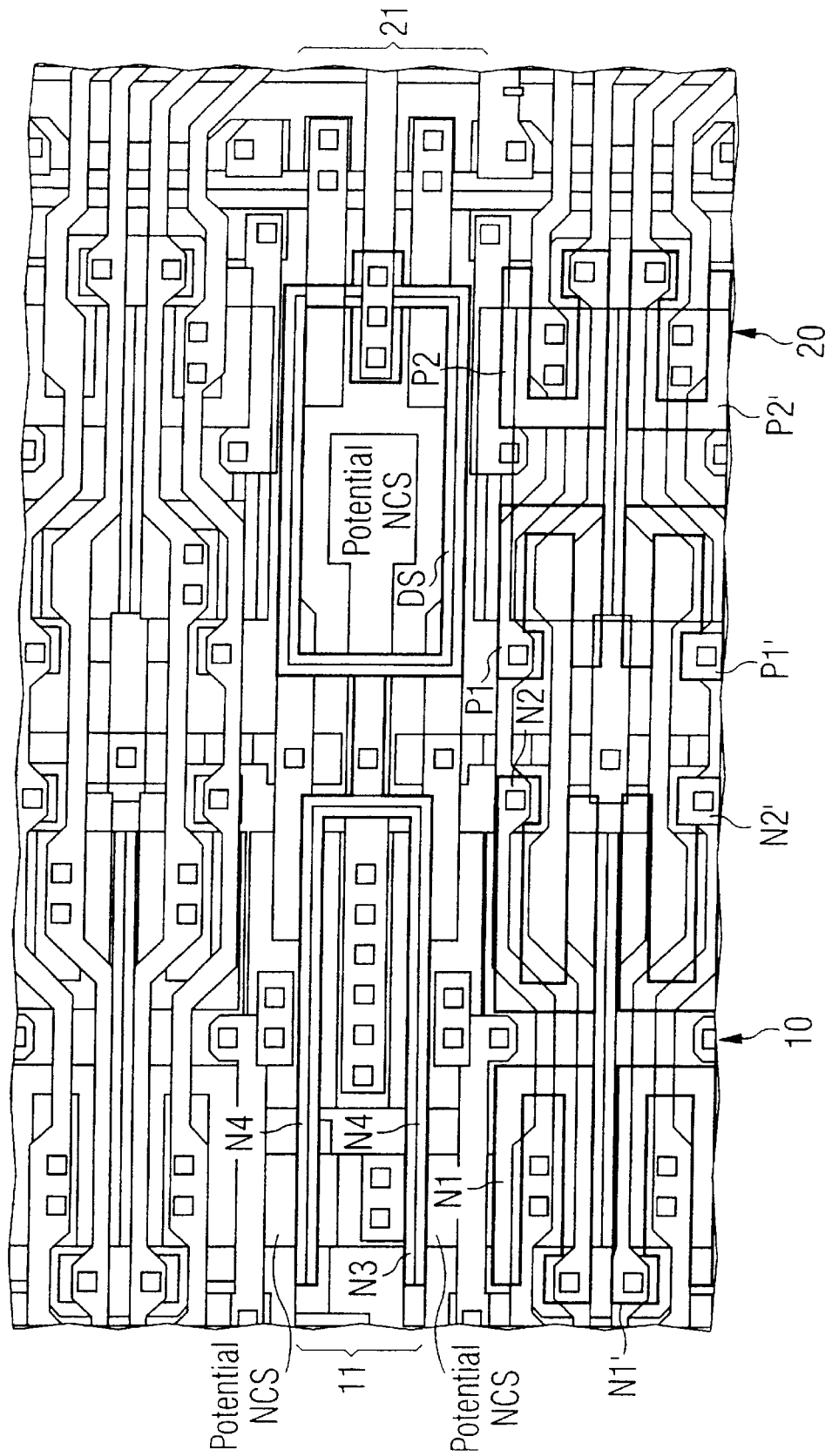
FIG. 1 is a plan view layout of the gate plane of sense amplifiers of an integrated DRAM memory module according to the prior art.
Figure 2:
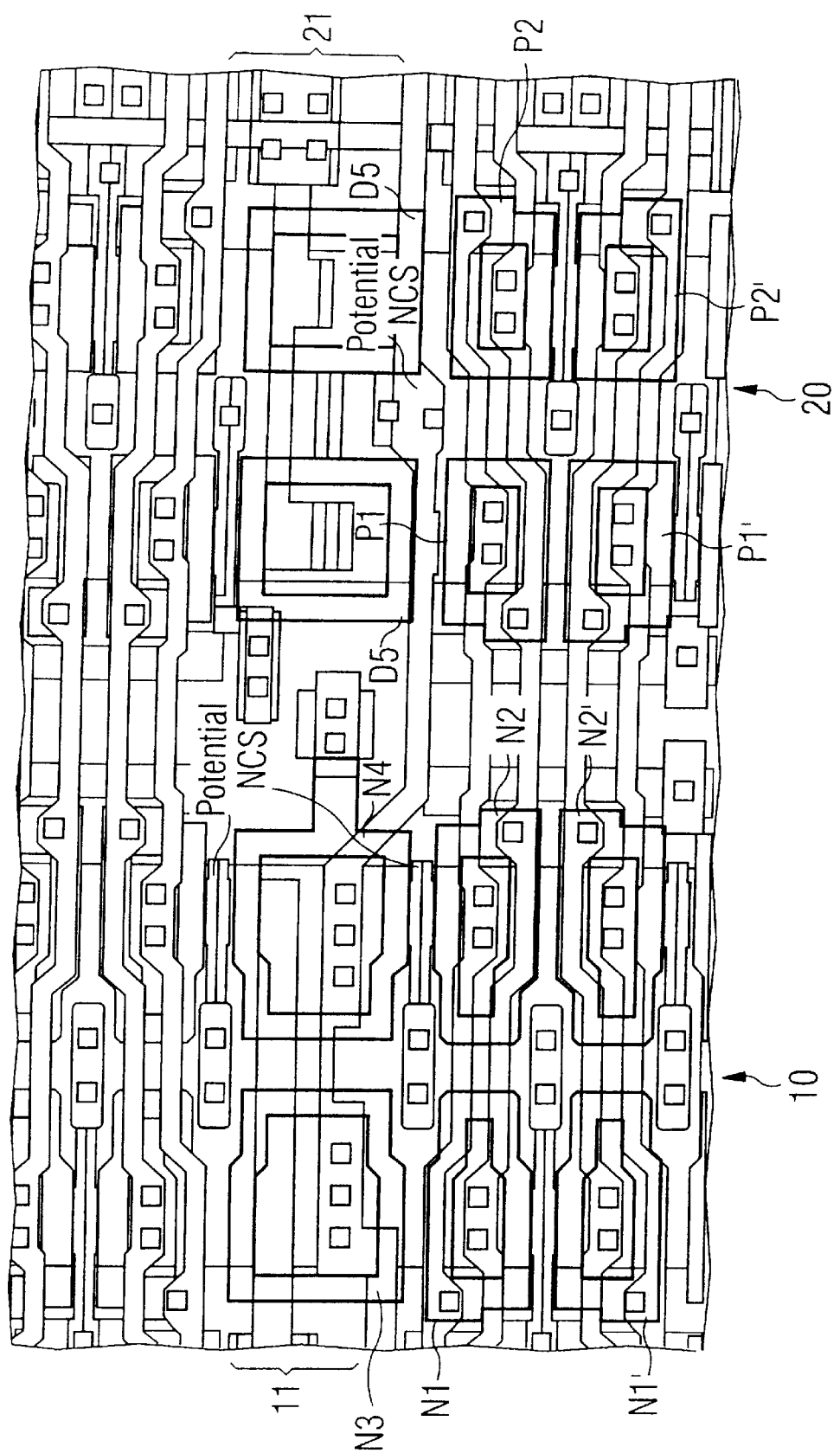
FIG. 2 is a plan view layout of the gate plane of sense amplifiers of an integrated DRAM memory module according to the invention.

Referring now to the figures of the drawing in detail, FIG. 1 and FIG. 2 show two strips or rows—lying next to one another—of gates of transistors which are used for amplification and for voltage equalization between sense amplifier drive signals NCS, PCS of integrated DRAM memory modules (the acronym NCS stands for Negative Current Supply, and PCS stands for Positive Current Supply). These two rows are generally designated by the reference 10 and 20, respectively.

Except for "disturbance locations", each of the rows 10 and 20 is constructed from identical transistor structures or constituents, namely from amplification transistors N1, N2, N1', N2', . . . in the row 10 and P1, P2, P1', P2', . . . in the row 20. Insofar as they are visible, the remaining transistors in the layout illustrated are not provided with reference numerals. The transistors N1, N2, P1, P2 and N1', N2' and P1', P2' are uniformly spaced apart from one another in the longitudinal direction of the rows 10, 20. Moreover, they are likewise uniformly spaced apart transversely with respect to the rows 10, 20. Furthermore, these transistors are arranged in pairs such that they lie opposite to one another within the rows (in the transverse direction thereof). Thus, by way of example, in the row 10, the transistor N1 lies opposite the transistor N2 and the transistor N1' lies opposite the transistor N2'. In the same way, in the row 20, the transistor P2 lies opposite the transistor P1 and the transistor P2' lies opposite the transistor P1'.

The structures of these amplification transistors are extremely symmetrical or identical and merge into one another through rotation about the axis perpendicular to the plane of the drawing or through mirroring at a plane perpendicular to the plane of the drawing. Thus, by way of example, a mirroring plane lies between the transistor pairs N1, N2 and N1', N2', and P1, P2 and P1', P2'. Furthermore, the transistors within the pairs merge into one another through rotation and translation. By way of example, the transistor N1 merges into the transistor N2 through a rotation through 180° and a displacement by the lateral distance between the transistors N1 and N2. The same applies to the rest of the transistor pairs.

What is essential for reliable functioning of the sense amplifiers and for defect-free fabrication during the exposure of a wafer is that each transistor is situated in the same transistor environment, or that the region of proximity of each transistor is the same or identical. This basic requirement made of the layout of the sense amplifiers of the integrated DRAM memory module under discussion is disturbed in the region 11 and 21 of the rows 10 and 20, respectively. In other words, the region of proximity of the transistors adjoining the region 21 and 21', respectively, that is the gates of the transistors N1, N2 and P1, P2, is not identical to the regions of proximity in the rows 10, 20 with transistors or transistor pairs that directly succeed one another in the row.

The "disturbance locations" 11 and 21 are formed by a pair of voltage equalization transistors N3 and N4 and a dummy structure DS, respectively.

As is immediately apparent from FIG. 1, the transistors N1', N2' and P1', P2' have, as neighbors, corresponding transistors N1, N2 and P1, P2, respectively, with a predetermined region of proximity being maintained. This region of proximity is interrupted for the transistors N1, N2 and P1, P2 opposite the disturbance locations 11, 21, respectively. This interruption is defined, on the one hand, by a greater distance between the transistors N1, N2, and P1, P2, and the transistors N3, N4, and the dummy structure, respectively, in comparison with the distances between the transistors N1, N2 and N1', N2'. Furthermore, the contours of the transistors N3, N4 in their position opposite the transistors N1, N2 clearly differ with respect to the structure thereof, which is clearly interrupted in the transverse direction, whereas the corresponding structure of the transistors N3, N4 provides continuous transverse strips.

A similar proximity is "seen" by the transistors P1, P2 in the form of the dummy structure DS, which interrupts the uniform distance between the transistors P1, P2 and P1', P2' within the row 20. In addition, the dummy structure DS in its position opposite the transistors P1, P2 with a strip structure interrupted in the transverse direction differs from the structure thereof with a continuous strip structure.

The disturbance locations found in the layout of FIG. 1 are not found in the layout of the integrated DRAM memory module according to the invention in accordance with FIG. 2. Thus, the layout in accordance with FIG. 2 differs from that in accordance with FIG. 1 in the region of the voltage equalization transistors N3, N4 and the dummy structure, respectively, by virtue of the fact that these structural constituents in their position opposite the adjoining amplification transistors N1, N2 and P1', P2', respectively, have the same structural elements, namely in the present case a course of the neutral facing edges with mirrored symmetry.

With regard to the amplification transistor N1 and the equalization transistor N3, this means, for example, that these transistors have mutually facing edges with a stepped edge running mirror-symmetrically. In a similar manner, the voltage equalization transistors P1, P2 in their position opposite the dummy structures have the same continuous edge structure as the latter. Added to this is the fact that the amplification transistors N1, N2 are at the same distance with respect to the voltage equalization transistors N3, N4 as relative to the amplification transistors N1', N2'. The same applies to the row 20, in which the identical distance between the transistor pairs P1, P2 and P1', P2' is again found in the distance of the transistor pair P1, P2 relative to the dummy structure DS, likewise formed as a separate pair.

As a result, however, the amplification transistors and voltage equalization transistors in the rows 10, 20 in each case have the same region of proximity across the entire row, which benefits their reliable functioning in the same way as their fabrication by the exposure of a corresponding structure on a wafer.

Adaptation of the layout of the voltage equalization transistors to the layout of the amplification transistors is preferably effected in the gate areas, which are depicted in FIG. 2 in a manner outlined by borders in the case of the voltage equalization transistors N3, N4 and in the case of the amplification transistors N1, N2. Corresponding adaptation is advantageous, however, for each conductive layer of the voltage equalization transistors and of the amplification transistors. Equally, corresponding adaptation of the conductive areas and/or conductive layers of the dummy structure DS to the conductive areas and/or conductive layers of the amplification transistors P1, P2 is advantageous.

We claim:

1. An integrated DRAM memory module, comprising:
a plurality of sense amplifiers each formed from a multiplicity of transistor structures arranged in rows and comprising amplification transistors for bit line signal amplification, said amplification transistors lying opposite one another in pairs, being structurally identical, and arranged uniformly spaced apart in the row;

voltage equalization transistors for voltage equalization between sense amplifier drive signals disposed to interrupt a respective row formed with amplification transistors situated in a structurally identical transistor environment;

said voltage equalization transistors having a structure in a region of proximity to respectively adjoining said amplification transistors identical to a structure of said adjoining said amplification transistors; and said voltage equalization transistors being spaced from said adjoining amplification transistors at a spacing distance equal a spacing distance between said amplification transistors of the row.

2. The integrated DRAM memory module according to claim 1, wherein facing edges of mutually adjacent said amplification transistors and voltage equalization transistors are formed with an identical contour.

3. The integrated DRAM memory module according to claim 1, which comprises a dummy structure interrupting the row formed of amplification transistors situated in a structurally identical transistor environment, and wherein said dummy structure in the region of proximity to the adjoining amplification transistors is adapted identically to a structure thereof, and wherein said dummy structure is spaced a distance from said mutually adjoining amplification transistors equal a spacing distance between said amplification transistors of the row.

* * * * *